United States Patent [19]

Petrus et al.

[11] Patent Number: 4,580,161

[45] Date of Patent: Apr. 1, 1986

[54] CABLE TELEVISION SUBSCRIBER CONTROL SYSTEM INCLUDING ADDRESSABLE FILTERS HAVING A VARIABLE POLE

[75] Inventors: Peter R. Petrus, Syracuse, N.Y.; Raymond F. St. Louis, West Caldwell, N.J.

[73] Assignee: Pico Products, Inc., Liverpool, N.Y.

[21] Appl. No.: 443,546

[22] Filed: Nov. 22, 1982

[51] Int. Cl.⁴ .................. H04N 7/10; H04N 7/16
[52] U.S. Cl. .................... 358/86; 358/114; 358/118; 455/4
[58] Field of Search ........... 358/86, 114, 115, 118; 455/3, 4, 5

[56] References Cited

U.S. PATENT DOCUMENTS

| | | | |
|---|---|---|---|
| 3,859,457 | 1/1975 | Kirk, Jr. | 455/3 X |
| 3,934,079 | 1/1976 | Barnhart | 455/4 X |
| 3,989,887 | 11/1976 | Murphy | 358/114 |
| 4,057,829 | 11/1977 | Moorehead | 455/5 X |
| 4,245,245 | 1/1981 | Matsumoto et al. | 358/118 X |
| 4,268,859 | 5/1981 | Ost | 358/114 |
| 4,268,860 | 5/1981 | Blonder | 358/118 |
| 4,322,854 | 3/1982 | Bundens et al. | 455/5 |
| 4,367,557 | 1/1983 | Stern et al. | 455/4 |
| 4,450,481 | 5/1984 | Dickinson | 455/5 X |
| 4,454,538 | 6/1984 | Toriumi | 455/5 X |

*Primary Examiner*—Keith E. George
*Attorney, Agent, or Firm*—Kenyon & Kenyon

[57] ABSTRACT

A filter for use in a cable television system for filtering out a given channel comprising a two pole filter, said filter including one pole which is fixed at the center frequency to be tuned out and a second variable pole responsive to an input voltage, the second pole adapted to vary in frequency about the first pole.

The filter is employed in addressable control system which includes an address generator at a head end, generating address control signals for each of a plurality of remote subscribers, a modulator for modulating a carrier with the address and control signal and coupling it onto cables, circuits at receiving terminals for receiving and demodulating the modulated carrier to recover the address signals, address decoding means for each subscriber to decode the address and control signals and circuits responsive to the decoding means to select the channels which each subscriber will receive. The system also has an encoder for encoding the status of the receive signals and a modulator for modulating a return carrier with the encoded states and putting this on the cable so that the signals may be demodulated at the head end. To carry out the demodulating and also to modulate the return signals, a local oscillator and mixer is used which generates both an intermediate frequency for the mixer and a carrier frequency for the return signal.

19 Claims, 10 Drawing Figures

CABLE TELEVISION SUBSCRIBER CONTROL SYSTEM INCLUDING ADDRESSABLE FILTERS HAVING A VARIABLE POLE

BACKGROUND OF THE INVENTION

This invention relates to communications in general and, more particularly, to a subscriber control system for communicating with subscriber terminals at remote locations via cable.

In the cable T.V. area, a customer buys separate services separately. For example, in one particular cable system there is available a basic cable service, a movie channel, an entertainment channel, and a sports channel. The subscriber pays for each separately. It is thus necessary that the cable service be able to control which of the services the customer receives. In the past, it has been the common practice to accomplish this in one of two ways. One way of doing this is to place at the subscriber multitap i.e., at a location outside the home from which a number of homes are fed, negative traps. These negative traps are filters which are put in place and which trap or filter out the channels to which the subscriber is not subscribing. This requires, each time a subscriber changes his subscription, that a serviceman be sent out to remove or insert the negative trap. The other manner of insuring that only those who subscribe receive a channel is through the use of scrambling. The channels for which one must pay extra are scrambled and the subscriber is provided with a descrambler. This, of course, increases the overall cost and requires additional equipment which must be maintained. Furthermore, in either of these instances, it is difficult to selectively supply to subscribers an individual event for which they pay separately (per view), for example a major prize fight or other sporting event, concert or the like.

Thus, there is a need for an improved system which permits addressing subscribers in a cable system to, in effect, enable and disable tiers of service which are paid for separately.

SUMMARY OF THE INVENTION

The present invention provides such a system. A key element of the system is a tuned trap in combination with switching means for switching the tuned trap in and out of the circuit. The tuned trap, which utilizes a varactor diode for tuning, contains two sections which provide a two pole filter. One of the poles is fixed and the other pole is tuned back and forth through the first pole at a predetermined rate. What this results in is a scramble which is not recoverable since in the system of the present invention it is not intended to be decoded. Rather, with the addressable system of the present invention, when the subsciber subscribes, that trap is simply bypassed or disconnected. Thus, unlike present scramble systems which can be avoided since, as a practical matter, a scramble which is too difficult cannot be used, a subscriber with the system of the present invention cannot, other than by getting into the equipment and modifying it, this equipment being outside of his house on a pole, defeat the scramble.

In the system of the present invention, in addition to transmitting T.V. signals over the cable, subscribers are addressed by means of an F.S.K. [Frequency Shift Key] modulated 103.8 MHz Carrier. The system can address 10,000 subscribers per minute for per view service. Feedback is provided to indicate the status of the addressed subscribers.

This system also can provide alarm services and is capable of addressing alarm customers at a rate of 2200 subscribers per minute for continuously readdressing subscriber terminals with tier latch commands and interrogating the subscriber terminal as to the status of its tier latches. The tier latches are the switches which switch in and out the tuned traps and can also be switches relating to an alarm system. The data is returned to the central computer location on 24.3 MHz FSK carrier. The two-way system is, of course, not absolutely necessary. The system will work simply by sending out the addresses and command information. The replies, however, help to pinpoint failures in the system so that prompt service calls can be made.

The present system is designed such that each subscriber terminal must receive its correct address in the same command twice in succession before it will execute the command. This double-valid data requirement has the effect of reducing the error rate.

The subscriber terminal, one of which is provided for each one to four subscribers, is housed in a high security housing about the size of a line extender amplifier. Co-ax wiring is provided between the outputs of this multi-tap and the subscriber drops. In accordance with the present invention, the terminal is powered through subscriber drop by means of a calculator-type low voltage power supply on the subscriber's premises. Thus, normally each subscriber will be supplying power to the common terminal, although the design is such that the terminal will operate properly with at least two power supplies connected out of the four possible. Included within the subscriber terminal is a housing or common printed circuit board and subscriber printed circuit boards, one for each subscriber. The common board contains an RF demodulator, 9 bit address decoder and a scramble generator. Each of the subscriber boards contains a 5 bit address, 4 bit data decoder, an 8 bit addressable latch, tuned traps pin diode switch drivers, a 9 bit data encoder and 8 pin diode switches. Each housing is assigned an address prior to installation using a computer which blows address fuses on the housing PC board and prints the housing serial number which is the same as the address. The subscriber printed circuit board is unaddressed and received its address on being plugged into the housing. The system is such that the installers need have no knowledge of binary or trinary addressing and incorrect and duplicate addresses are avoided. Furthermore, the subscriber boards are interchangeable.

As noted above, the tuned traps of the present invention provide a type of scramble which cannot be decoded. The scramble generator includes means for generating a scramble square-wave voltage which is fed to a varactor which tunes the one pole of the trap. It varies in tuned frequency at the scramble frequency rate. When the pole is tuned to the same frequency as the other pole of the trap, the trap will be tuned to its maximum depth of about 60 dB. When the varactor tuned pole is out of tune with the other poles, the trap will be at its minimum attenuation of about 30 dB. This scheme has the effect of attenuating the visual carrier by 30 dB plus adding a 97% AM scramble modulation to the visual carrier. In addition to destroying the sync modulation, it also destroys the video modulation resulting in a hard scramble regardless of fine tuning adjustment to the T.V. set. In addition to the video scramble, an audio scramble occurs due to the phase modulation which the trap induces on the visual carrier. This phase modulation of the visual carrier appears on the 4.5 MHz audio intercarrier and has the same effect as FM modulation of the audio carrier. The amount of FM deviation equivalent caused by the phase modulation is somewhat dependant on the T.V. receiver.

The frequency of the scramble is obtained from the data pulse stream in order to establish a stable and uniform scramble frequency throughout the C.A.T.V. [cable T.V.] system since the frequency for the "best scramble" is critical. To prevent the loss of scramble signal in the event that the data stream is interrupted, a free-running scramble oscillator is included in the subscriber terminal. This oscillator is normally locked to the data frequency, but should the data stream be interrupted, the oscillator will continue to run close to the ideal scramble frequency.

At the central location, the equipment for controlling the subscriber terminals includes five basic parts:
1. A self-contained subscriber controller which is capable of operating independently and contains memory and battery backup. This unit continually addresses the subscriber terminals with data which has been stored in its memory;
2. A mini-computer;
3. A hard disk drive with cassette copy control;
4. Intelligent terminals, e.g., micro-computers; and
5. At least one printer.

Other than the subscriber controller, the rest of the equipment is standard off the shelf hardware. For example, the mini-computer could be a DEC mini-computer or possibly an IBM Personal Computer. The intelligent terminals can also be IBM Personal Computers. The mini-computer and the intelligent terminals are used to, first of all, provide the data to the memory in the subscriber-controller and to change and monitor data. This memory indicates the services to which each subscriber has subscribed. This controller is optically isolated from the system and designed for a higher MTBF than the rest of the system for continuous service. Through the use of battery backup, along with a real time clock, the subscriber controller, which can store up to 4 days of per view turn on information will continue to operate, even if disconnected from the rest of the equipment, thereby preventing disaster in the case of a computer failure or power failure just before a per view program turn-on time, e.g., just before a big prize fight. In the event of a failure of the controller, subscriber terminals will maintain their memory indefinitely as long as they are powered.

The purpose of the mini-computer and the hard disk are to store subscriber statistics and contain numerous programs such as customer statistics, per view program guide, billing, mailing labels, printer control, controller control, trouble reporting, self-monitoring, maintenance programs, etc. The intelligent terminals interact with the mini-computer and the subscriber controller to update information, i.e., customer tier commands, per view turn-on, billing date start, etc. The terminals, since they are preferably computers can also be used in a local mode as word-processors for doing accounts payable, general ledger payroll income tax, etc. It is also possible to provide programs on these computers that use the subscriber data-base but which cannot change it.

The system of the present invention also allows the provision of a subscriber alarm system. The subscriber alarm terminal is located on the subscriber premises and connected to the subscriber drop. Alarm subscribers are interrogated five times more often than non-alarm subscribers resulting in a rate of 10,000 per minute. In a system with 333 alarm customers, each alarm terminal would be polled every two seconds. The alarm system can send eight different alarm codes on a priority bases. In addition, its data encoder has six spare bits for future data [$3^6 = 729,000$] different codes, the system being a trinary system.

The system has the capacity for serving from 5,000 to 100,000 subscribers, dependant only on the number of memory integrated circuits added and the size of the hard disk memory used. The subscriber terminals are addressed with a combination of binary and trinary bits that allows for a maximum of 629,856 subscribers per system.

DETAILED DESCRIPTION

Figure 1:
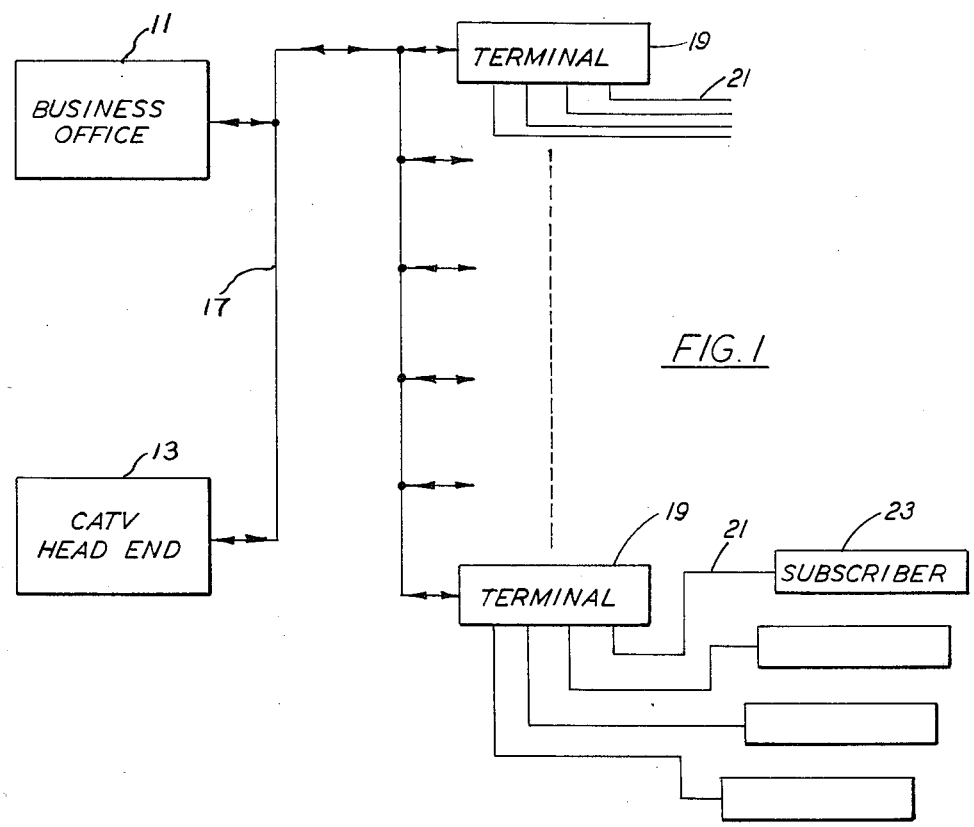
FIG. 1 is an overall block diagram of the system of the present invention.

FIG. 1 is a very basic block diagram of the system of the present invention. The basic elements include the office equipment, indicated generally as 11, in which the main piece of equipment is the controller. Also included, however, is the mini-computer, disk drive and intelligent terminals. Information from the office 11 is sent to the head end 13 where it is added to the incoming T.V. signal which is transmitted over the line 17 to a plurality of terminals 19 each of which have up to four customer drops 21. Each customer drop 21 may then be connected to customer equipment 23 including a converter and television set. The controller in the office addresses each of the terminals enabling the various tiers of service, depending on the customer's desires.

Figure 2B:
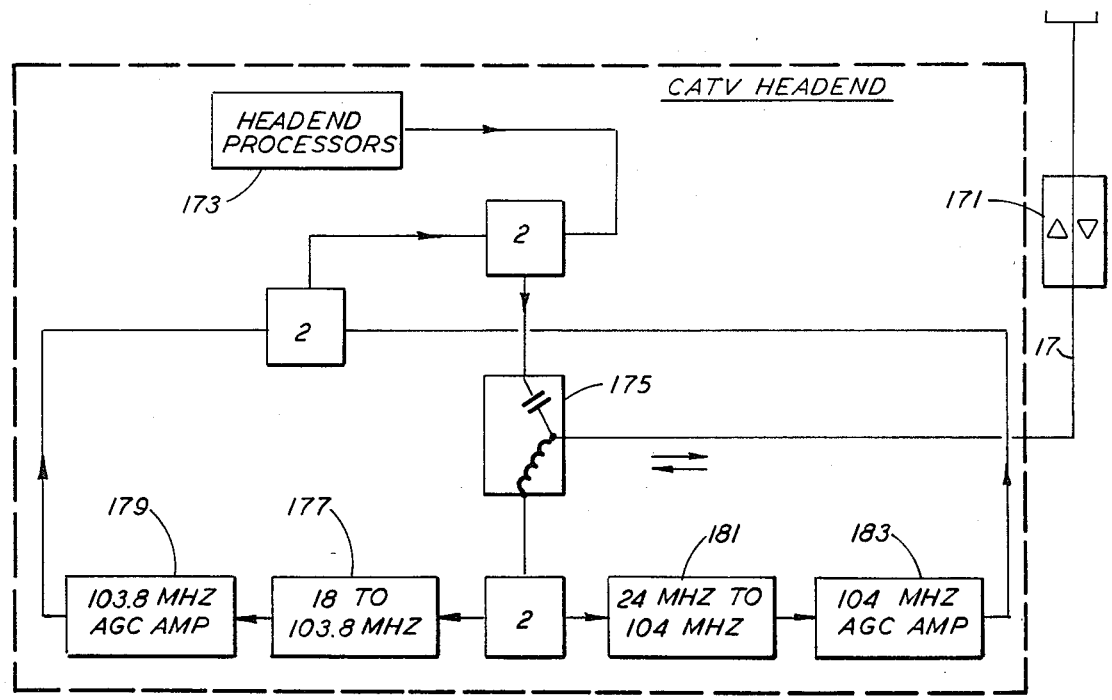
FIG. 2B is a block diagram of the equipment located at the business office.
Figure 2A:
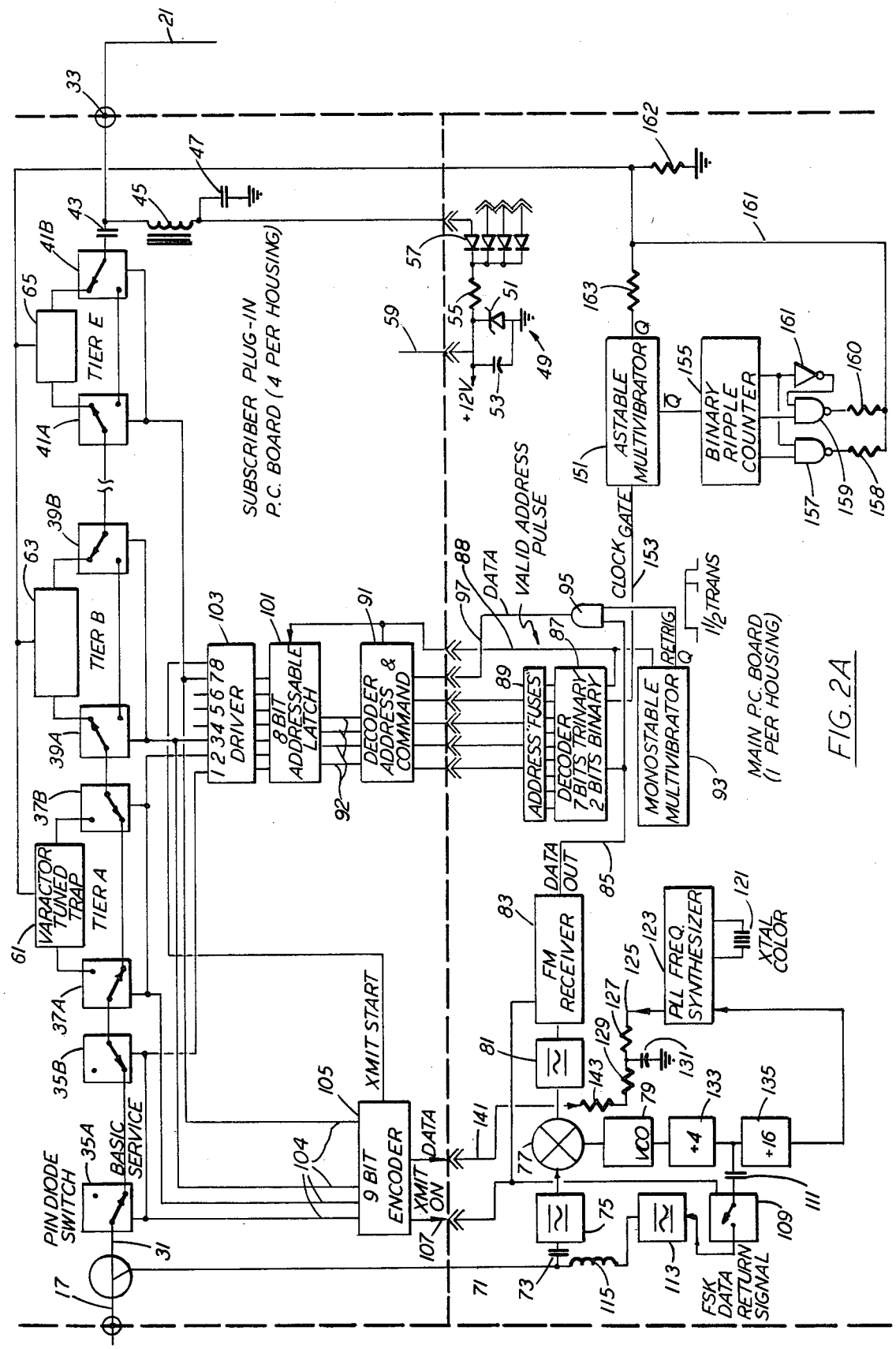
FIG. 2A is a block diagram of the subscriber terminal according to the present invention.

FIG. 2A is a more detailed block diagram of the equipment at an individual terminal. The incoming signal on line 17 is fed over a line 31 to couple video and audio to the output 33 at which point a cable can be connected providing the customer drop 21. The line 31 is coupled into a first pair of switches 35a and 35b which are closed to provide basic service. If these switches are open, then the customer receives nothing. A plurality of additional pairs of switches, such as switches 37a, 37b, 39a, 39b, 41a and 41b are used to provide the various tiers of service. It is contemplated that tiers A through E may be provided, one of these being a per view tier, i.e., a tier which is selected only for viewing a particular event. As used here, a tier may be a single channel or a group of channels. More conventionally it is used to refer to a group of channels. Thus, in more general terms, the pairs of switches control the reception of a portion of the T.V. frequency spectrum which may include one or more channels. The incoming signal on line 31 is coupled in serial through all of these pairs of switches to the output 33. There is a capacitor 43 in the output for isolation of a DC voltage which is fed back from the subscriber over the cable through input 33, through a filter comprising a choke 45 and capacitor 47, to the power supply unit 49 which includes a 'zener diode 51 to clamp the voltage to 12 volts, a capacitor 53 and a resistor 55 for current limiting purposes. Coupled to the resistor 55 are four diodes 57 to isolate the power supplies of the different subscribers from each other. The power supply with its 12 volt output on line 59 provides all of the power for the unit of FIG. 2A. The switches are used to coupled in tuned traps to trap one of the tiers of service. Thus with all traps in place the trapped tiers are scrambled. Those frequencies not trapped pass through unaffected. This is shown by spectrum and layer traces of FIGS. 5A and 5B.

Figure 5A:
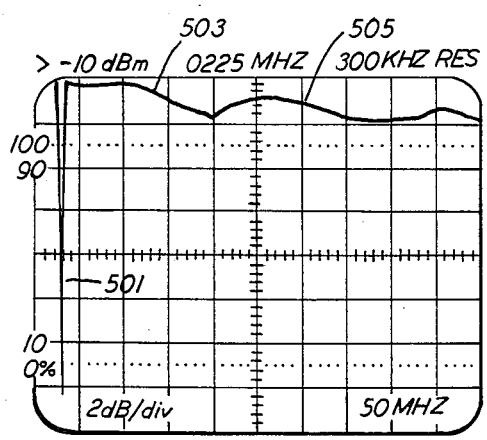
FIGS. 5A, 5B, 5C and 5D are spectrum analysis diagrams showing the effect of the trap of FIG. 3.

FIG. 5A shows reference lines for two channels of a coaxial switch. The center line is 225 MHz, frequency divisions 5 MHz/div. As shown by FIG. 5A from the point of zero frequency, at which high attenuation is indicated by a dip 501 through 450 MHz covering all of the cable spectrum the two traces 503 and 505 are identical and show essentially no attenuation.

Figure 5B:
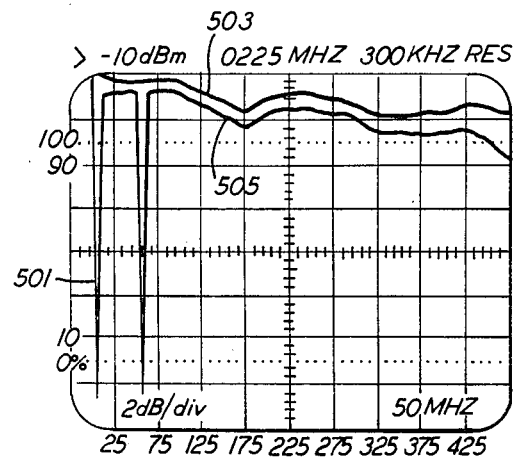

FIG. 5B shows the effect of placing a trap to tuned to Ch.2 at 55.25 MHz in one channel of the switch. The reference channel trace 503 is as before. Now, however, the trace 505 of the channel with the trap exhibits a sharp dip (high attenuation) at the Ch.2 frequency. All other frequencies pass essentially unattenuated. This corresponds, for example, to a case where switches 37A and 37B of FIG. 2A are connected to trap 61 (a Ch.2 trap) and all other switches are bypassing their respective traps.

The switches 37a and b, 39a and b, and 41a and b will be in a position shunting a tuned trap 61, as shown in connection with switches 37a and 37b or coupling through tuned trap 63 or 65 as shown in connection with switches 39a and b, and 41a and b. Each of the tuned traps will be tuned to a particular channel, for example, the mid-band channels A–I. When the trap is in place it will filter out that particular channel. If one assumes, for example that the tiers correspond to channels and are in the position shown, channel A would pass through without being filtered out by a trap 61. However, since the switches 39a and b, and 41a and b are in the position connecting in the trap, channels B and E would be filtered out and could not be received by that particular customer.

The remainder of the circuitry comprises circuits for controlling the setting of these switches and for feeding back information concerning the state of the various switches. As indicated previously, the information is transmitted on a 103.8 MHz carrier. This signal is provided on a line 71 through a capacitor 73 to a 103.8 MHz band pass filter 75, the output of the filter being an input to a mixer 77 receiving an input from a 97.3 MHz voltage-controlled oscillator. The output of the mixer at 6.5 MHz is coupled through a 6.5 MHz band pass filter 81 into a FM receiver 83 which receives the information and provides output data on line 85. The data enters a decoder 87 where the terminal address is decoded. The decoder 87 may be a motorola MC 145028 which receives a nine bit serial word and decodes it and compares it with the address set in by address fuses 89. If the received address corresponds to that set in on the fuses a valid transmission outtput is generated on line 88. Address fuses 89 also supply address inputs to decoders 91 in the individual subscriber boards. A valid address signal from decoder 87 triggers a monostable multivibrator 93 which enables an AND gate 95 to couple additional data which defines the selected tiers over line 97 to the decoders 91 (only one of four of which is shown). These decoders may be MC 15027 which interpret the first five bits as address and the last four bits as data. The decoder 91 when a proper address is recognized, provides an output on lines 92 which has three address bits and one status bit, providing a command. This data is coupled into an eight bit addressable latch 101, upon generation of the valid address signal from decoder 91, which, in turn, operates a driver 103. The driver outputs control the various pairs of switches, the first output, for example, controlling switches 35a and 35b. In succession, the decoder 91 provides information for setting each of the eight latches in addressable latch 101. This permits controlling seven tiers of service, the eighth address being a signal to start transmission for feedback. Feedback is accomplished through the use of a nine bit encoder 105. This may be an MC 145026. Encoder 105 responds to a transmit start signal, which is the eighth output of the latch 101, through driver 103. The data encoded onto line 12 is the state, as provided on lines 104, of the outputs of driver 103. It also provides an output on line 107 indicating that transmit is on. This mutes the FM receiver 83. It also closes a switch 109 coupling a signal through a capacitor 111 to a 24.33 MHz band pass filter 113 and then through a choke 115 onto line 71 from which it will be provided to line 17 and back to the head end. Necessary frequencies both for receiveing and transmitting are generated using a crystal 121 which oscillates at 3.579545 MHz. This is a very conventional crystal since it is used in essentially all color television sets. This crystal is used along with a phase locked loop frequency synthesizer 123 to provide a control voltage output on line 125. The control voltage is coupled through a filter formed by resistors 127 and 129 with a capacitor at 131 to ground at their junction, into the voltage controlled oscillator 79. Output from the voltage controlled oscillator is coupled back a divide by four stage 133 and divide by sixteen 135 to a divide by 434 input of the synthesizer 123. This loop maintains the frequency during receiving, 97.3 MHz. It also maintains a center frequency of 97.3 MHz while being frequency shift keyed by data coupled on line 141 from the nine bit encoder through resistor 143 to provide a frequency shift keyed 24.33 MHz return signal. Because the filter comprising capacitor 131 and resistors 127 and 129 has a long time constant, the control voltage supplied by capacitor 131 stays at that providing the center frequency while the actual frequency is modulated about this center frequency by the voltage through resistor 143. If only a one way system is required mixer 77 can be supplied simply from a 97.3 MHz crystal controlled oscillator. The remainder of the circuits of FIG. 2A are for generating the square wave signal which is utilized to tune the varactors in the traps 61, 63, and 65. This circuit includes an astable multivibrator 151 which is syncronized to a clock signal on line 153, the clock signal being obtained from the decoder 87 and at the data frequency. One output of the multivibrator is coupled through a resistor divider comprising resistors 162 and 163 to ground the junction of these two which is the line coupled to traps 61, 63 and 65 to modulate them. This has on it a square wave varying between 15 volts and ground. The other output of the multivibrator is coupled into a binary ripple counter 155 which has a divide by 32, a divide by 64 and a divide by 4096 output. These outputs are combined in Nand gates 157 and 159 and inverter 169 to provide a further modulator signal output on line 161. This is used to further modulate the final output. The outputs from gates 157 and 159 are coupled through resistors 158 and 160 to the junction of resistors 162 and 163. These gates when on pull the signal toward ground. The resulting mdoulation causes in the aforementioned video and audio scrambling.

FIG. 2B shows the head end portion of the system. The output of the head end is coupled through a plurality of bi-directional line amplifiers 171 in the line 17. Included in the head end unit are head end processors 173 generating video information. This video information is coupled through a filter 175 to the output line 17. Also received within this unit is the address and control information. This information comes in on line 17 on a carrier of 18 MHz which is frequency shift keyed with the information. In the head end, the 18 MHz information, after passing through filter 175, which includes a high pass section and a low pass section, is converted in a converter 177 to 103.8 MHz which is then amplified in an amplifier 179 and coupled back to the output through filter 175. The information now at 103.8 MHz is transmitted to the various terminals. Returning information at 24 MHz is received and converted in converter 181 to 104 MHz. The 104 MHz signal is amplified in amplifier 183 and transmitted back to the business office at this frequency.

Figure 2C:
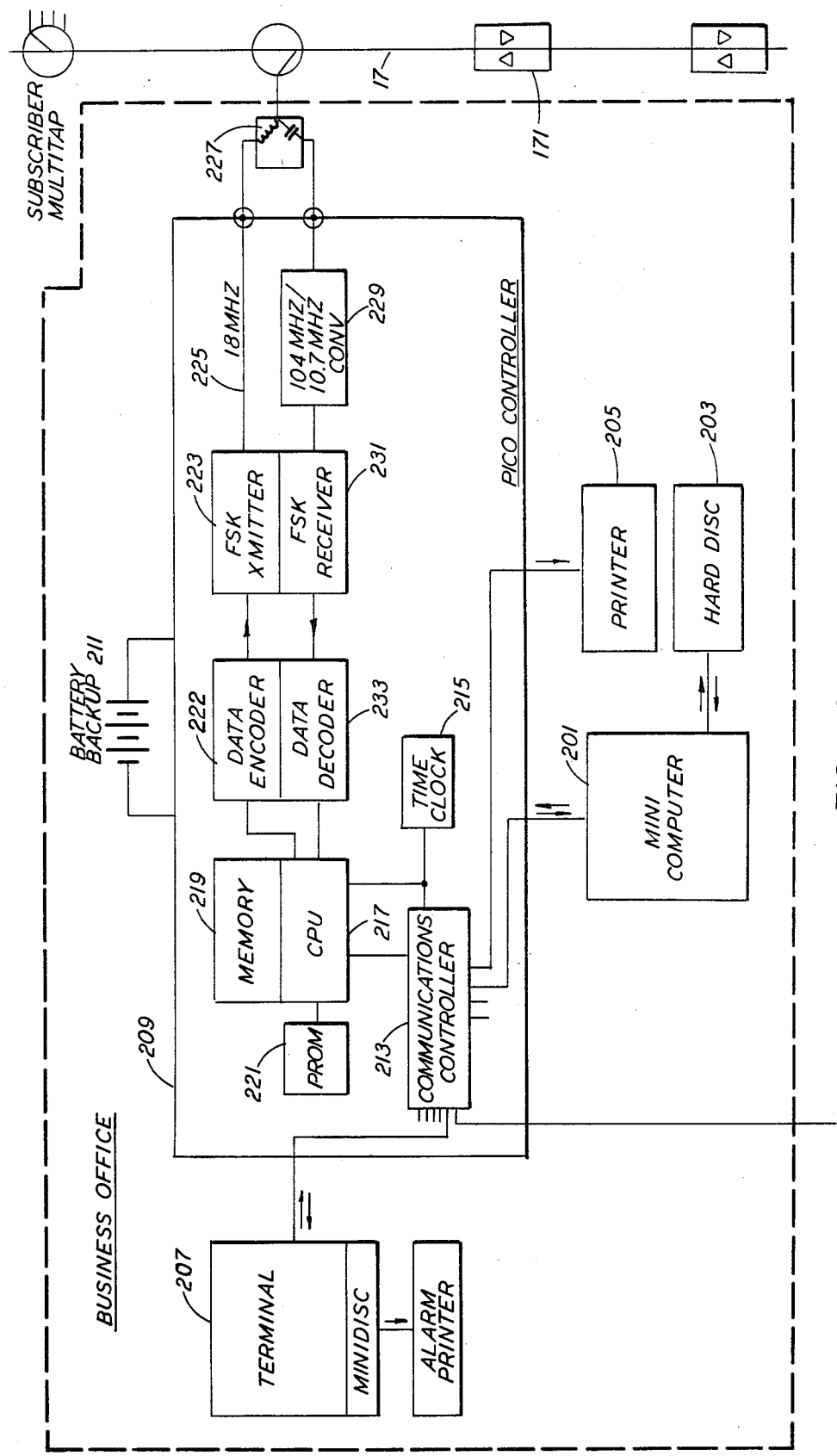
FIG. 2C a block diagram of equipment located at the CATV head end.

FIG. 2C shows the equipment at the business office. Visible is another line amplifier 171 in the line 17. The equipment includes a mini-computer 201 which is coupled to a hard disk 203 for memory purposes along with a printer 205. Also provided are one or more intelligent terminals 207. The key part of the system is the controller 209 which includes its own battery backup power supply 211. Within the controller is contained a communications controller 213 which handles communications with external devices such as the intelligent terminals 207, the mini-computer 201, the printer 205, etc. Communications controller also receives an input from a time clock 215 which establishes the system frequencies. Communication controller and time clock 215 couple into a CPU 217 which is provided with a static memory 219 and a program memory 221. The static memory 219 stores all of the switch or latch status changes for all consumers for a period of four days. This information is then, under control of the communications controller and CPU provided as an output through a data encoder 222 which converts it to trinary data and a frequency shift keying transmitter 223 which provides the output at 18 MHz on line 225 which is then coupled through filter 227. This is the information, then, which is provided to the head end.

The received information from the head end at 104 MHz is coupled through filter 227 to a 104 to 10.7 MHz converter 229 and FSK receiver 231 and thence to a data decoder 233 whereupon the data is fed back into the CPU. This information can then be coupled through the communications control 213 to the mini-computer 201 where it is available for interrogation from the intelligent terminal 207 and can also be used to generate alarms, etc. or provide outputs on printer 205 to indicate malfunctions in the system.

Figure 3:
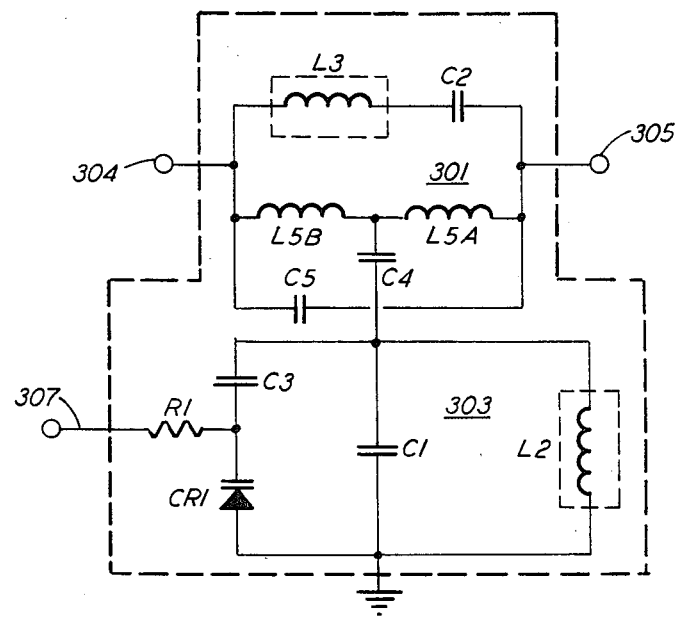
FIG. 3 is a circuit diagram of the varactor tuned trap according to the present invention.
Figure 5C:
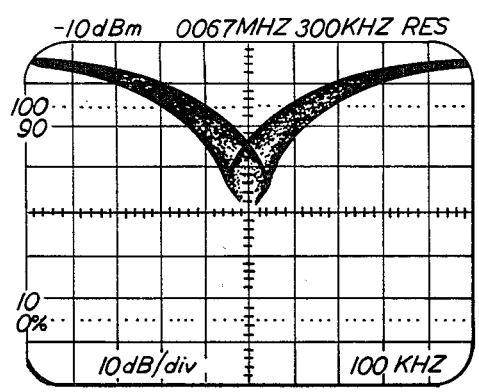
Figure 5D:
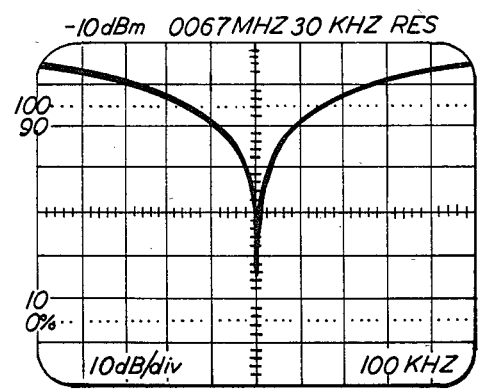

FIG. 3 is a circuit diagram of one of the varactor tuned traps such as the trap 61. The trap includes an upper section 301 and a lower section 303. The upper section 301 includes an input terminal 304 and an output terminal 305. In one parallel branch are coils L5A and L5B. In another parallel branch is a variable coil or inductor L3 in series with a capicitor C2. The lower portion 303 of the filter, which is the voltage tuned portion, includes three branches. The middle branch has a capacitor C1 to ground, the left hand branch, in parallel with capacitor C1, contains a capacitor C3 and varactor diode CR1 in series and, the third branch, also in parallel with C1 a variable inductor L2. The control input for the varactor diode CR1 is at an input terminal 307 which is coupled through a resistor R1 to the junction between diode CR1 and C3. A capacitor C5, is coupled between input terminal 304 and output terminal 305 to improve operation. The circuit of FIG. 3 has two poles. One pole is tuned to the frequency of the channel to be filtered out. The other pole is caused, by means of a square wave modulation input on terminal 307, to shift back and forth across the first pole. The result of this is shown by the waveforms of FIGS. 5A and 5B which represent outputs obtained from the screen of a spectrum analyzer. FIG. 5C shows both sections tuned to the same frequency and FIG. 5D, the one pole detuned. In effect, when both sections are tuned to the same exact frequency phase cancellation, i.e. theoretically infinite dB of attenuation result. Only by tuning through this point is phase cancellation insured.

Figure 4:
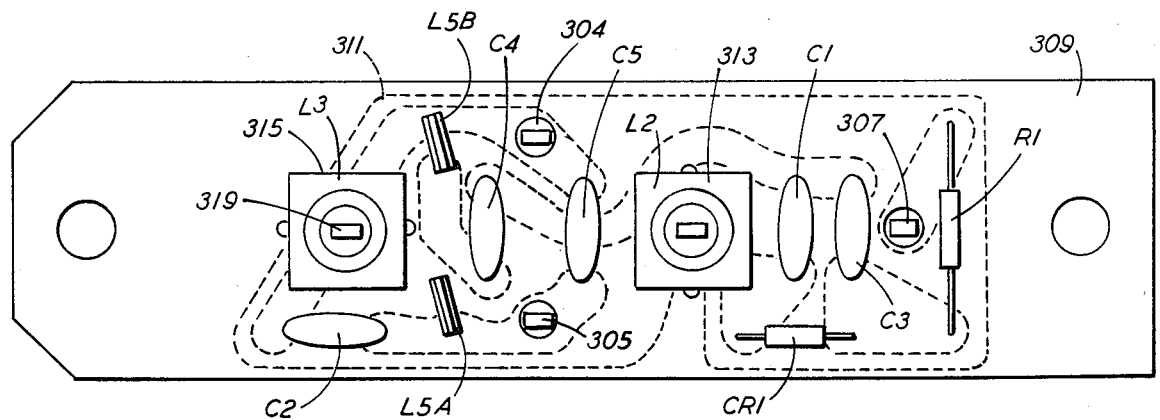
FIG. 4 illustrates the lay-out of the trap of FIG. 3.

The physical arrangement of the parts of FIG. 3 are illustrated in FIG. 4. All of the components are mounted on an elongate printed circuit board 309. The copper pattern 311 on the other side of the board is shown in dotted lines. As illustrated, coils L2 and L3 which are variable are contained within cans 313 and 315 and include a screwdriver adjustable core 319.

What is claimed is:

1. A filter for use in a cable television system for filtering out a given portion of the frequency spectrum comprising a two pole filter, said filter including one pole which is fixed at the T.V. frequency of the portion to be removed and a second variable pole responsive to an input voltage, said second pole adapted to vary in frequency about said first pole, such as to cause said second pole to move in and out of phase cancellation with said first pole to thereby modulate the visual carrier.

2. A filter according to claim 1 wherein said second pole is tuned by means of a varactor diode.

3. A filter according to claim 1 or 2 and further including means for generating a periodic wave input for controlling said second pole.

4. A filter according to claim 3 wherein said means for generating a periodic wave include means for incorporating various frequency components into said periodic wave.

5. A filter according to claim 3 in combination with a cable television system and further including:
(a) a first single pole, double throw switch having its common terminal coupled to an incoming signal and one of its other terminals coupled to the input of said filter; and
(b) a second switch having its common terminal coupled to a subscriber drop, and a terminal coupled to the output of said filter, the remaining terminals of said first and second switches connected together, whereby in one position a signal will be coupled through said filter and in another position said signal will bypass said filter.

6. A filter according to claim 5 and further including address decoding means for decoding the address of an individual subscriber coupled po operate said first and second switches.

7. An addressable control system for a cable television system which includes a head end, from which television signals are transmitted on a plurality of channels, a plurality of receiving terminals each of which supplies a group of subscribers via subscriber drops, and cables interconnecting said head end with said terminals, comprising:
 (a) means at said head end for generating address and control signals for each subscriber;
 (b) means at said head end for modulating a carrier with said address and control signals and for coupling said modulated carrier onto said cables;
 (c) means at each of said receiving terminals for receiving said modulated carrier and demodulating it to recover said address and control signals;
 (d) address decoding means for each terminal and each subscriber within a terminal coupled to decode said address and control signals;
 (e) means at each terminal responsive to said address decoding means and said control information to select the channels which each subscriber will receive, said means to select comprising negative traps and means to alternately switch in or bypass said negative traps, said negative traps comprising two pole filters having a first ploe tuned to the frequency to be filtered out and a second pole which is variable in response to an input signal about said first pole and further including means at said terminal for providing a periodic wave signal to said filter trap to vary the frequency of said second pole;
 (f) means to encode the status of the received commands at each terminal;
 (g) means, at each terminal, to frequency shift key modulate a return carrier with said coded states and couple said modulated return carrier onto said cable; and
 (h) means at said head end for receiving said modulated carrier and recovering said encoded states.

8. Apparatus according to claim 7 wherein said means to supply said periodic wave is synchronized to the address and control signals.

9. Apparatus according to claim 7 and further including means to compare said encoded states with corresponding command data.

10. Apparatus according to claim 7, wherein said means for receiving and demodulating include a local oscillator and mixer, said local oscillator generating an intermediate frequency for said mixer, and wherein said means to frequency shift key modulate said return carrier comprise:
 (a) means to frequency shift key said oscillator with data representing said coded states; and
 (b) a divider for dividing the output of said oscillator by n to provide said modulated return carrier.

11. Apparatus according to claim 10 wherein said local oscillator includes:
 (a) a phase locked loop frequency synthesizer;
 (b) a crystal coupled to said synthesizer;
 (c) a voltage controlled oscillator receiving a control voltage from said synthesizer;
 (d) a filter having long time constant disposed between said synthesizer and said voltage controlled oscillator;
 (e) a divide by n circuit coupled to the output to said voltage controlled oscillator.

12. Apparatus according to claim 7 wherein said means for demodulating include a local oscillator and mixer and wherein said local oscillator comprises an oscillator adapted to generate intermediate frequency for said mixer and a carrier frequency for said return signal.

13. An addressable control system for a cable television system which includes a head end, from which television signals are transmitted on a plurality of channels, a plurality of receiving terminals, each of which supplies a group of subscribers via subscriber drops, and cables interconnecting said head end with said terminals comprising:
 (a) means at said head end for generating address and control signals for each subscriber;
 (b) means at said head end for modulating a carrier with said address and control signal and for coupling said modulated carrier onto said cables;
 (c) means at said receiving terminals for receiving said modulated carrier and demodulating it to recover said address and control signals;
 (d) address decoding means for each terminal and each subscriber within a terminal coupled to decode said address and control signals; and
 (e) means at each terminal responsive to said address decoding means and said control information to select the channels which each subscriber will receive, comprising two pole filters having a first pole tuned to the frequency to be filtered out and a second pole which is variable in response to an input signal about said first pole and means at said terminal for providing a periodic wave signal to said two pole filter to vary the frequency of said second pole, and means to alternately switch in or by-pass said two pole filters.

14. Apparatus according to claim 13 wherein said means for providing a periodic wave signal is synchronized to the address and control signals.

15. Apparatus according to claim 13 wherein said means for demodulating includes a local oscillator and mixer.

16. Apparatus according to claim 13 and further including means to encode the status of the received commands at said terminal and means to modulate a return carrier with said encoded states and couple said modulated return carrier onto said cable and means at said head end for receiving said modulated carrier and recovering said encoded states.

17. Apparatus according to claim 16 and further including means to compare said encoded states with corresponding command data.

18. Apparatus according to claim 16 wherein said means for demodulating include a local oscillator and mixer and wherein said local oscillator comprises an oscillator adapted to generate an intermediate frequency for said mixer and a carrier frequency for said return signal.

19. Apparatus according to claim 18 wherein said local oscillator includes:
 (a) a phase lock loop frequency synthesizer;
 (b) a crystal coupled to said synthesizer;
 (c) a voltage controlled oscillator receiving a control voltage from said synthesizer;
 (d) a filter having a long time constant disposed between said synthesizer and said voltage controlled oscillator; and
 (e) a divide by n circuit coupled to the output of said voltage controlled oscillator.

* * * * *

UNITED STATES PATENT AND TRADEMARK OFFICE
CERTIFICATE OF CORRECTION

PATENT NO. : 4,580,161

DATED : April 1, 1986

INVENTOR(S) : Peter R. Petrus and Raymond F. St. Louis

It is certified that error appears in the above-identified patent and that said Letters Patent is hereby corrected as shown below:

In the Abstract, line 23, change "moduate" to --modulate--.

Col. 6, line 40, after "back" insert --through--; and after "sixteen" insert --stage--.

Col. 9, line 1, change "po" to --to--.

Signed and Sealed this

Twenty-eighth Day of October, 1986

[SEAL]

*Attest:*

DONALD J. QUIGG

*Attesting Officer*  *Commissioner of Patents and Trademarks*